United States Patent
Nessim et al.

(12)

(10) Patent No.: US 11,663,759 B1
(45) Date of Patent: May 30, 2023

(54) SYSTEM AND METHOD FOR PROCESSING MULTI-DIMENSIONAL AND TIME-OVERLAPPING IMAGING DATA IN REAL TIME WITH CLOUD COMPUTING

(71) Applicant: Cloudstream Medical Imaging, Inc., Houston, TX (US)

(72) Inventors: Maurice Nessim, Houston, TX (US); Jun Tang, Houston, TX (US); Yi Luo, Houston, TX (US); Chuck Peng, Houston, TX (US)

(*) Notice: Subject to any disclaimer, the term of this patent is extended or adjusted under 35 U.S.C. 154(b) by 0 days.

(21) Appl. No.: 17/712,919

(22) Filed: Apr. 4, 2022

(51) Int. Cl.
*G06T 9/00* (2006.01)
*H03M 7/30* (2006.01)
(Continued)

(52) U.S. Cl.
CPC ............. *G06T 11/008* (2013.01); *G06T 9/00* (2013.01); *H03M 7/6005* (2013.01); *H04N 19/00* (2013.01); *G06T 2211/428* (2013.01)

(58) Field of Classification Search
CPC ...... H04N 19/70; H04N 19/30; H04N 19/176; H04N 19/172; H04N 21/2347; H04N 21/2343; H04N 21/4405; H04N 21/6377; H04N 21/2187; H04N 9/8042; H04N 19/46; H04N 19/105; H04N 19/119; H04N 21/23614; H04N 19/167; H04N 21/236; H04N 21/4347; H04N 21/234327; H04N 21/6437; H04N 19/17; H04N 19/587; H04N 21/434; H04N 19/00; H04N 19/66; H04N 13/161; H04N 21/23424; H04N 21/4348; H04N 21/44; G06N 3/0454;
(Continued)

(56) References Cited

U.S. PATENT DOCUMENTS 9,984,206 B2 5/2018 Spencer
2012/0221728 A1 8/2012 Dubbels et al.
(Continued)

FOREIGN PATENT DOCUMENTS

CN 109431606 A * 3/2019 ............. A61B 34/20
CN 111429460 B * 9/2020 ............... G06T 7/10
(Continued)

OTHER PUBLICATIONS

Machine translation via Search of CN 109431606 A, retrieved Jun. 14, 2022, 21pages. (Year: 2022).*
(Continued)

*Primary Examiner* — Matthew C Bella
*Assistant Examiner* — Dennis Rosario
(74) *Attorney, Agent, or Firm* — Hunton Andrews Kurth LLP

(57) ABSTRACT

The present embodiments include a system and method for processing multi-dimensional images in real time through the use of third-party servers and cloud computing. The system includes a data acquisition processor, a data storage unit, an administrator processor, and a server. The server can be a cloud-based server. The method includes receiving multi-dimensional imaging data, compressing and blending the image data, transmitting the image data to a server, decompressing and deblending the data, generating multi-dimensional images, and transmitting the imaging data back to the administrator processor.

22 Claims, 4 Drawing Sheets

(51) Int. Cl.
*H04N 19/00* (2014.01)
*G06T 11/00* (2006.01)

(58) Field of Classification Search
CPC ... G06T 2207/10016; G06T 9/00; G06T 7/11; G06T 5/002; G06T 5/001; G06T 3/4015; G06T 7/0012; G06T 1/20; G06T 2207/20221; G06T 2207/20212; G06T 2207/20216; G06T 2207/20224; G06T 2207/30004; G06T 2207/30068; G06T 2207/30104; G06T 2207/30101; G06T 7/00; G06T 5/003; G06T 2207/10081; G06T 2207/10088; G06T 2210/41; G06T 11/008; G06T 11/003; G06T 11/006; G06T 11/005; G06T 2207/10116; G06T 2211/40; G06T 2207/10104; G06T 2207/10101; G06T 2207/10108; G06T 2207/10112; G06T 7/38; G06T 2200/04; G06T 3/4038; G06T 2210/08; G06T 15/08; G06T 15/503; G06T 15/80; G06T 2207/10072; G06T 2207/10076; G06T 2207/10084; G06T 2207/10092; G06T 2207/10096; G06T 2211/404; G06T 2211/408; G06T 2211/412; G06T 2211/416; G06T 2211/421; G06T 2211/424; G06T 2211/428; G06T 2211/432; G06T 2211/436; G06T 2207/10132; G06T 19/006; G06T 7/174; G06T 17/00; G06T 19/00; G06T 19/003; G06T 15/00; G06T 11/60; H04L 67/12; H04L 67/1097; H04L 9/50; H04L 69/22; H04L 69/04; H04L 51/04; H04L 65/65; H04L 47/2416; G06V 10/82; G06V 10/40; G06V 30/194; G06V 10/25; G06V 10/95; G06V 2201/03; G06V 40/15; G06V 40/14; G06V 40/145; G06V 20/46; G06V 20/695; G06V 10/993; G06V 30/414; G16H 30/20; G16H 30/40; G16H 30/00; G06K 9/6288; G06K 9/6232; A61B 5/742; A61B 5/0022; H03M 7/6005

See application file for complete search history.

(56) References Cited

U.S. PATENT DOCUMENTS

| | | |
|---|---|---|
| 2013/0243282 A1 | 9/2013 | Sato et al. |
| 2015/0078126 A1 | 3/2015 | Lu |
| 2015/0110225 A1 | 4/2015 | Thevenin et al. |
| 2015/0369915 A1 | 12/2015 | Eibye et al. |
| 2015/0374347 A1 | 12/2015 | Manigoff et al. |
| 2016/0030000 A1 | 2/2016 | Sandhu et al. |
| 2016/0220211 A1 | 8/2016 | Yamada |
| 2016/0232655 A1 | 8/2016 | Lachner et al. |
| 2020/0007516 A1 | 1/2020 | Westin et al. |
| 2020/0253587 A1 | 8/2020 | Oleksandrovych et al. |
| 2020/0351852 A1 | 11/2020 | McConnell et al. |
| 2021/0080573 A1 | 3/2021 | Bachmann et al. |
| 2021/0097641 A1 | 4/2021 | Iyer et al. |
| 2021/0166807 A1* | 6/2021 | Quennesson ........... G06T 15/04 |
| 2021/0215642 A1 | 7/2021 | Fincke et al. |
| 2021/0308490 A1* | 10/2021 | Hu ......................... G01P 13/00 |
| 2021/0339046 A1* | 11/2021 | Lachaine ............. A61N 5/1039 |

FOREIGN PATENT DOCUMENTS

| | | | |
|---|---|---|---|
| DE | 4436263 A1 * | 4/1996 | ............. G01N 23/04 |
| DE | 102008037094 A1 * | 11/2009 | ....... G06F 17/30265 |
| JP | 2010072765 A * | 4/2010 | |
| JP | 2022513427 A * | 2/2022 | |
| WO | 2012154335 A2 | 11/2012 | |

OTHER PUBLICATIONS

Machine translation via Search of JP 2010-972765 A, retrieved Jun. 14, 2022, 21 pages. (Year: 2022).*

Machine translation via Search of DE 4436263 A1, retrieved Jun. 14, 2022, 5 pages. (Year: 2022).*

Machine translation via Search, Machine Learning Approach to Real-time Patient Movement Monitoring of JP 2022-513427 A to Lechene, retrieved Aug. 9, 2022, 61 pages. (Year: 2022).*

Machine translation of DE 10 2008 037 094 A1 to Thomas, retrieved Aug. 9, 2022, 22 pages. (Year: 2022).*

Machine translation II via Search, Arithmetic Processing Device, Method, Program, and Recording Medium of JP 2010-072765 A to Katsunori, retrieved Aug. 9, 2022, 34 pages. (Year: 2022).*

Machine translation: Image Segmentation Method, Image Segmentation Model Training Method, Device and Storage Medium of CN 111429460 B to Cui et al., 44 pages, retrieved Dec. 6, 2022. (Year: 2022).*

Guasch, Liuis et al., Full-Waveform Inversion Imaging of the Human Brain, Mar. 6, 2020, npj Digital Medicine; vol. 3, No. 28. pp. 1-12.

Luo, Yi et al., Full-Travel Time Inversion, Geophysics, vol. 81, No. 5, R261-R274, Sep.-Oct. 2016.

Fincke, Jonathan et al., Quantitative Sound Speed Imaging of Cortical Bone and Soft Tissue: Results From Observational Data Sets, IEEE Transactions on Medical Imaging, vol. 41, No. 3, pp. 502-514, Mar. 2022.

Li, Cuiping et al., An Improved Automatic Time-of-Flight Picker for Medical Ultrasound Tomography, Ultrasonics, vol. 49, pp. 61-72, 2009.

U.S. Non-Final Office Action dated Nov. 30, 2022 received in U.S. Appl. No. 17/943,806, filed Sep. 13, 2022.

* cited by examiner

SYSTEM AND METHOD FOR PROCESSING MULTI-DIMENSIONAL AND TIME-OVERLAPPING IMAGING DATA IN REAL TIME WITH CLOUD COMPUTING

FIELD OF DISCLOSURE

The present disclosure relates generally to a system and method for processing multi-dimensional and overlapping imaging data in real time. Imaging data includes but is not limited to ultrasound data, CT, MM, and other medical imaging data.

BACKGROUND

Current ultrasound imaging is performed either on a specific hardware or PC with GPU. To capture a multi-dimensional image from within the human body, an image acquisition device will take multiple, time-lapse images generated from high frequency sound waves. Once enough imaging information has been generated, the imaging information is transmitted onto a processor either within a medical device or a server associated with the medical office in which the ultrasound is conducted. The processing time for certain data geometry can be lengthy, often taking several minutes and up to an hour. Once the data has been processed, the user can view the multidimensional images and continue observation from a different position or angle.

The choices of imaging algorithms and data processing workflows are often limited by the computation capacity of the imaging hardware or PC in order to generate images in real time. Consequently, the current processing time for multi-dimensional ultrasound imaging is too long. It can take up to an hour to process a multi-dimensional image and even more time to observe the image and render a diagnosis. This downtime is a serious loss to both the provider and the patient. The medical office must reserve a waiting space for the patient, and the provider must block out their schedule for the next hour in anticipation of the imaging results. Consequently, both the provider and the patient waste valuable time. Furthermore, the medical office is limited to seeing only a certain number of ultrasound patients per time period because only so many imaging results can be processed in a given time. Ultimately, this downtime is wasteful and frustrating. Additionally, this extra time causes computational costs and lesser computational speed. Therefore, there exists a deficiency in the current medical imaging industry.

Provided in the present embodiments is a new system and method for processing multi-dimensional images in real time.

SUMMARY OF THE DISCLOSURE

Embodiments of the present disclosure include a system for the real time processing of multi-dimensional and time-overlapping imaging data, the system comprising a data acquisition processor configured to receive one or more sets of multi-dimensional imaging data from one or more image collection devices, the data acquisition processor further configured to transmit the one or more sets of multi-dimensional imaging data over one or more express buses; a data storage unit configured to store at least one or more sets of multi-dimensional imaging data; an administrator processor coupled to the data storage unit, the administrator processor further configured to receive the one or more sets of multi-dimensional imaging data from the data acquisition processor over one or more express buses, blend the one or more sets of multi-dimensional imaging data, compress the one or more sets of multi-dimensional imaging data, and, upon a compression of the one or more sets of multi-dimensional imaging data, transmit the one or more sets of multi-dimensional imaging data over a network; and a server configured to receive the one or more sets of multi-dimensional imaging data over the network, the server further configured to decompress the one or more sets of multi-dimensional imaging data, deblend the one or more sets of multi-dimensional imaging data, convert, by one or more server processors further configured with one or more predetermined algorithms, the sets of the multi-dimensional imaging data into one or more multi-dimensional images, and transmit, over the network, the one or more multi-dimensional images to the administrator processor.

Embodiments of the present disclosure also include a method for the real time processing of multi-dimensional and time-overlapping imaging data, the method comprising the steps of receiving, by a data acquisition processor, one or more sets of multi-dimensional imaging data from one or more image collection devices; transmitting, by the data acquisition processor, the one or more sets of multi-dimensional imaging data to an administrator processor; blending, by the administrator processor, the one or more sets of multi-dimensional imaging data; compressing, upon blending the one or more sets of multi-dimensional imaging data, the one or more sets of multi-dimensional imaging data; transmitting, upon compressing the one or more sets of multi-dimensional imaging data, the one or more sets of multi-dimensional imaging data to a server; decompressing, by the server, the one or more sets of multi-dimensional imaging data; deblending, by the server, the one or more sets of multi-dimensional imaging data; converting, by a group of one or more server processors further configured with one or more predetermined algorithms, the one or more sets of multi-dimensional imaging data into one or more multi-dimensional images; and transmitting, over a network, the one or more multi-dimensional images to the administrator processor. For a typical dataset, a subsequent transmission is activated after the previous one is completely recorded so that each recording won't contain the reflection energy from previous and next transmission. For time sharing transmission and data collection, additional processing procedures are applied to handle the data recorded with multiple transmissions on top of each other. To generate one image, multiple transmissions are used to insonify the target from different directions. To speed up the scan time, the transmissions can be conducted without having to wait for the previous transmissions to be finished.

Embodiments of the present disclosure also include a computer readable non-transitory medium comprising computer executable instructions that, when executed on a processor, perform procedures comprising the steps of: receiving, by a data acquisition processor, one or more sets of multi-dimensional imaging data from one or more image collection devices; transmitting, by the data acquisition processor, the one or more sets of multi-dimensional imaging data to an administrator processor; blending, by the administrator processor, the one or more sets of multi-dimensional imaging data; compressing, upon blending the one or more sets of multi-dimensional imaging data, the one or more sets of multi-dimensional imaging data; transmitting, upon compressing the one or more sets of multi-dimensional imaging data, the one or more sets of multi-dimensional imaging data to a server; decompressing, by the server, the one or more sets of multi-dimensional imaging data; deblending, by the server, the one or more sets of multi-dimensional imaging data; converting, by a group of one or more server processors further configured with one or more predetermined algorithms, the one or more sets of multi-dimensional imaging data into one or more multi-dimensional images; and transmitting, over a network, the one or more multi-dimensional images to the administrator processor.

BRIEF DESCRIPTION

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
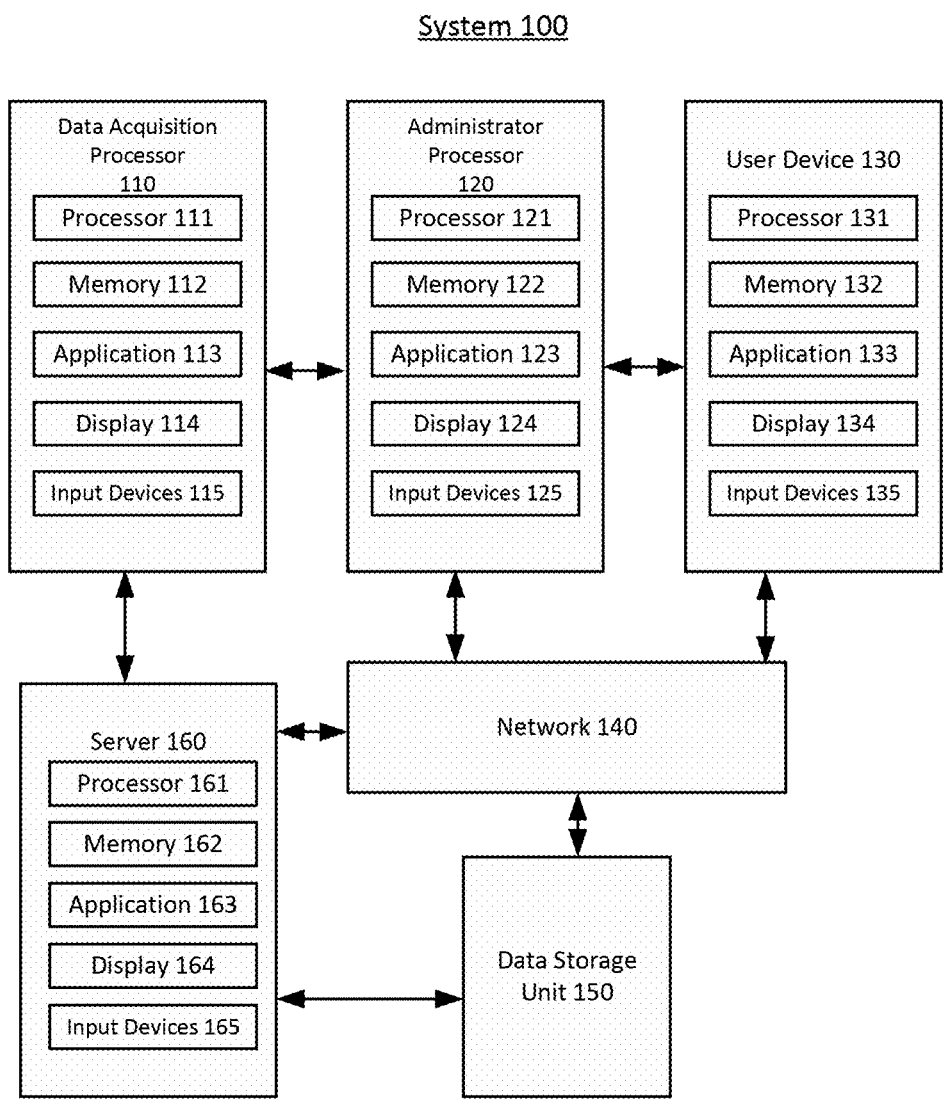
FIG. 1 illustrates a block diagram of a system according to an exemplary embodiment.

Exemplary embodiments of the invention will now be described in order to illustrate various features of the invention. The embodiments described herein are not intended to be limiting as to the scope of the invention, but rather are intended to provide examples of the components, use, and operation of the invention.

Furthermore, the described features, advantages, and characteristics of the embodiments may be combined in any suitable manner. One skilled in the relevant art will recognize that the embodiments may be practiced without one or more of the specific features or advantages of an embodiment. In other instances, additional features and advantages may be recognized in certain embodiments that may not be present in all embodiments.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present embodiments relate generally to processing multi-dimensional, time-overlapping images in real time. Instead of relying on a processor that is associated with a specific medical device or server, the image data can be sent to one or more third party servers over a network. These servers can contain several processors. Furthermore, the servers can be associated with cloud computing. The cloud-based servers can process the imaging data significantly faster that on-site server which rely on a fewer amount of processors, resulting in a higher throughput and lower latency. This is because the cloud has a much large capacity—compared to standalone PCs—to dedicated computing resources.

As an example, a data acquisition device can retrieve multi-dimensional images from an ultrasound device or any device capable of capturing multi-dimensional images. After compressing and blending the imaging data, the data is sent over a network to a cloud-based server. The server receives the imaging data, decompresses the data, deblends the data, processes the imaging data, generates the multi-dimensional images, and transmits the images back to the processor.

FIG. 1 is a block diagram of a system according to an exemplary embodiment.

FIG. 1 illustrates a system 100 according to an example embodiment. The system 100 may comprise a data acquisition processor 110, an administrator processor 120, a user device 130, a network 140, a data storage unit 150, and a server 160. Although FIG. 1 illustrates single instances of components of system 100, system 100 may include any number of components.

The system can include one or more data acquisition processors 110. The data acquisition processor 110 may include a processor 111, a memory 112, and an application 113. The processor 111 may be a processor, a microprocessor, or other processor, and the data acquisition processor 110 may include one or more of these processors. The processor 111 may include processing circuitry, which may contain additional components, including additional processors, memories, error and parity/CRC checkers, data encoders, anti-collision algorithms, controllers, command decoders, security primitives and tamper-proofing hardware, as necessary to perform the functions described herein.

The processor 111 may be coupled to the memory 112. The memory 112 may be a read-only memory, write-once read-multiple memory or read/write memory, e.g., RAM, ROM, and EEPROM, and the data acquisition processor 110 may include one or more of these memories. A read-only memory may be factory programmable as read-only or one-time programmable. One-time programmability provides the opportunity to write once then read many times. A write-once read-multiple memory may be programmed at one point in time. Once the memory is programmed, it may not be rewritten, but it may be read many times. A read/write memory may be programmed and re-programed many times after leaving the factory. It may also be read many times. The memory 112 may be configured to store one or more software applications, such as the application 113, and other data, such as user's private data and financial account information.

The application 113 may comprise one or more software applications, such as a mobile application and a web browser, comprising instructions for execution on the data acquisition processor 110. In some examples, the data acquisition processor 110 may execute one or more applications, such as software applications, that enable, for example, network communications with one or more components of the system 100, transmit and/or receive data, and perform the functions described herein. Upon execution by the processor 111, the application 113 may provide the functions described in this specification, specifically to execute and perform the steps and functions in the process flows described below. Such processes may be implemented in software, such as software modules, for execution by computers or other machines. The application 113 may provide graphical user interfaces (GUIs) through which a user may view and interact with other components and devices within the system 100. The GUIs may be formatted, for example, as web pages in HyperText Markup Language (HTML), Extensible Markup Language (XML) or in any other suitable form for presentation on a display device depending upon applications used by users to interact with the system 100.

The data acquisition processor 110 may further include a display 114 and input devices 115. The display 114 may be any type of device for presenting visual information such as a computer monitor, a flat panel display, and a mobile device screen, including liquid crystal displays, light-emitting diode displays, plasma panels, and cathode ray tube displays. The input devices 115 may include any device for entering information into the data acquisition processor 110 that is available and supported by the data acquisition processor 110, such as a touch-screen, keyboard, mouse, cursor-control device, touch-screen, microphone, digital camera, video recorder or camcorder. These devices may be used to enter information and interact with the software and other devices described herein.

The system can include one or more administrator processors 120. The administrator processors 120 may include a processor 121, a memory 122, and an application 123. The processor 121 may be a processor, a microprocessor, or other processor, and the administrator processors 120 may include one or more of these processors. The processor 121 may include processing circuitry, which may contain additional components, including additional processors, memories, error and parity/CRC checkers, data encoders, anti-collision algorithms, controllers, command decoders, security primitives and tamper-proofing hardware, as necessary to perform the functions described herein.

The processor 121 may be coupled to the memory 122. The memory 122 may be a read-only memory, write-once read-multiple memory or read/write memory, e.g., RAM, ROM, and EEPROM, and the administrator processors 120 may include one or more of these memories. A read-only memory may be factory programmable as read-only or one-time programmable. One-time programmability provides the opportunity to write once then read many times. A write-once read-multiple memory may be programmed at one point in time. Once the memory is programmed, it may not be rewritten, but it may be read many times. A read/write memory may be programmed and re-programed many times after leaving the factory. It may also be read many times. The memory 122 may be configured to store one or more software applications, such as the application 123, and other data, such as user's private data and financial account information.

The application 123 may comprise one or more software applications, such as a mobile application and a web browser, comprising instructions for execution on the administrator processor 120. In some examples, the administrator processor 120 may execute one or more applications, such as software applications, that enable, for example, network communications with one or more components of the system 100, transmit and/or receive data, and perform the functions described herein. Upon execution by the processor 121, the application 123 may provide the functions described in this specification, specifically to execute and perform the steps and functions in the process flows described below. Such processes may be implemented in software, such as software modules, for execution by computers or other machines. The application 123 may provide graphical user interfaces (GUIs) through which a user may view and interact with other components and devices within the system 100. The GUIs may be formatted, for example, as web pages in HyperText Markup Language (HTML), Extensible Markup Language (XML) or in any other suitable form for presentation on a display device depending upon applications used by users to interact with the system 100.

The administrator processor 120 may further include a display 124 and input devices 125. The display 124 may be any type of device for presenting visual information such as a computer monitor, a flat panel display, and a mobile device screen, including liquid crystal displays, light-emitting diode displays, plasma panels, and cathode ray tube displays. The input devices 125 may include any device for entering information into the administrator processor 120 that is available and supported by the administrator processor 120, such as a touch-screen, keyboard, mouse, cursor-control device, touch-screen, microphone, digital camera, video recorder or camcorder. These devices may be used to enter information and interact with the software and other devices described herein.

The system can include one or more user devices 130. The user device 130 may be a network-enabled computer device. Exemplary network-enabled computer devices include, without limitation, a server, a network appliance, a personal computer, a workstation, a phone, a handheld personal computer, a personal digital assistant, a thin client, a fat client, an Internet browser, a mobile device, a kiosk, or other a computer device or communications device. For example, network-enabled computer devices may include an iPhone, iPod, iPad from Apple® or any other mobile device running Apple's iOS® operating system, any device running Microsoft's Windows® Mobile operating system, any device running Google's Android® operating system, and/or any other smartphone, tablet, or like wearable mobile device.

The user device 130 may include a processor 131, a memory 132, and an application 133. The processor 131 may be a processor, a microprocessor, or other processor, and the user device 130 may include one or more of these processors. The processor 131 may include processing circuitry, which may contain additional components, including additional processors, memories, error and parity/CRC checkers, data encoders, anti-collision algorithms, controllers, command decoders, security primitives and tamper-proofing hardware, as necessary to perform the functions described herein.

The processor 131 may be coupled to the memory 132. The memory 132 may be a read-only memory, write-once read-multiple memory or read/write memory, e.g., RAM, ROM, and EEPROM, and the user device 130 may include one or more of these memories. A read-only memory may be factory programmable as read-only or one-time programmable. One-time programmability provides the opportunity to write once then read many times. A write-once read-multiple memory may be programmed at one point in time. Once the memory is programmed, it may not be rewritten, but it may be read many times. A read/write memory may be programmed and re-programed many times after leaving the factory. It may also be read many times. The memory 132 may be configured to store one or more software applications, such as the application 133, and other data, such as user's private data and financial account information.

The application 133 may comprise one or more software applications, such as a mobile application and a web browser, comprising instructions for execution on the user device 130. In some examples, the user device 130 may execute one or more applications, such as software applications, that enable, for example, network communications with one or more components of the system 100, transmit and/or receive data, and perform the functions described herein. Upon execution by the processor 131, the application 133 may provide the functions described in this specification, specifically to execute and perform the steps and functions in the process flows described below. Such processes may be implemented in software, such as software modules, for execution by computers or other machines. The application 133 may provide graphical user interfaces (GUIs) through which a user may view and interact with other components and devices within the system 100. The GUIs may be formatted, for example, as web pages in HyperText Markup Language (HTML), Extensible Markup Language (XML) or in any other suitable form for presentation on a display device depending upon applications used by users to interact with the system 100.

The user device 130 may further include a display 134 and input devices 135. The display 134 may be any type of device for presenting visual information such as a computer monitor, a flat panel display, and a mobile device screen, including liquid crystal displays, light-emitting diode displays, plasma panels, and cathode ray tube displays. The input devices 135 may include any device for entering information into the user device 130 that is available and supported by the user device 130, such as a touch-screen, keyboard, mouse, cursor-control device, touch-screen, microphone, digital camera, video recorder or camcorder. These devices may be used to enter information and interact with the software and other devices described herein.

System 100 may include one or more networks 140. In some examples, the network 140 may be one or more of a wireless network, a wired network or any combination of wireless network and wired network, and may be configured to connect the user device 130, the server 160, the data storage unit 150 and the ATM 160. For example, the network 140 may include one or more of a fiber optics network, a passive optical network, a cable network, an Internet network, a satellite network, a wireless local area network (LAN), a Global System for Mobile Communication, a Personal Communication Service, a Personal Area Network, Wireless Application Protocol, Multimedia Messaging Service, Enhanced Messaging Service, Short Message Service, Time Division Multiplexing based systems, Code Division Multiple Access based systems, D-AMPS, Wi-Fi, Fixed Wireless Data, IEEE 802.11b, 802.15.1, 802.11n and 802.11g, Bluetooth, NFC, Radio Frequency Identification (RFID), Wi-Fi, and/or the like.

In addition, the network 140 may include, without limitation, telephone lines, fiber optics, IEEE Ethernet 902.3, a wide area network, a wireless personal area network, a LAN, or a global network such as the Internet. In addition, the network 140 may support an Internet network, a wireless communication network, a cellular network, or the like, or any combination thereof. The network 140 may further include one network, or any number of the exemplary types of networks mentioned above, operating as a stand-alone network or in cooperation with each other. The network 140 may utilize one or more protocols of one or more network elements to which they are communicatively coupled. The network 140 may translate to or from other protocols to one or more protocols of network devices. Although the network 140 is depicted as a single network, it should be appreciated that according to one or more examples, the network 140 may comprise a plurality of interconnected networks, such as, for example, the Internet, a service provider's network, a cable television network, corporate networks, such as credit card association networks, and home networks. The network 140 may further comprise, or be configured to create, one or more front channels, which may be publicly accessible and through which communications may be observable, and one or more secured back channels, which may not be publicly accessible and through which communications may not be observable.

System 100 may include a database or data storage unit 150. The data storage unit 150 may be one or more databases configured to store data, including without limitation, private data of users, financial accounts of users, identities of users, transactions of users, and certified and uncertified documents. The database 150 may comprise a relational database, a non-relational database, or other database implementations, and any combination thereof, including a plurality of relational databases and non-relational databases. In some examples, the database 150 may comprise a desktop database, a mobile database, or an in-memory database. Further, the database 150 may be hosted internally by the server 130 or may be hosted externally of the server 160, such as by a server, by a cloud-based platform, or in any storage device that is in data communication with the server 160.

The system can include a server 160. The server 160 may be a network-enabled computer device. Exemplary network-enabled computer devices include, without limitation, a server, a network appliance, a personal computer, a workstation, a phone, a handheld personal computer, a personal digital assistant, a thin client, a fat client, an Internet browser, a mobile device, a kiosk, a contactless card, or other a computer device or communications device. For example, network-enabled computer devices may include an iPhone, iPod, iPad from Apple® or any other mobile device running Apple's iOS® operating system, any device running Microsoft's Windows® Mobile operating system, any device running Google's Android® operating system, and/or any other smartphone, tablet, or like wearable mobile device. The server may be a combination of one or more cloud computing systems such as public clouds, private clouds, and hybrid clouds.

The server 160 may include a processor 161, a memory 162, and an application 163. The processor 161 may be a processor, a microprocessor, or other processor, and the server 160 may include one or more of these processors. The processor 161 may include processing circuitry, which may contain additional components, including additional processors, memories, error and parity/CRC checkers, data encoders, anti-collision algorithms, controllers, command decoders, security primitives and tamper-proofing hardware, as necessary to perform the functions described herein.

The processor 161 may be coupled to the memory 162. The memory 162 may be a read-only memory, write-once read-multiple memory or read/write memory, e.g., RAM, ROM, and EEPROM, and the server 160 may include one or more of these memories. A read-only memory may be factory programmable as read-only or one-time programmable. One-time programmability provides the opportunity to write once then read many times. A write-once read-multiple memory may be programmed at one point in time. Once the memory is programmed, it may not be rewritten, but it may be read many times. A read/write memory may be programmed and re-programmed many times after leaving the factory. It may also be read many times. The memory 162 may be configured to store one or more software applications, such as the application 163, and other data, such as user's private data and financial account information.

The application 163 may comprise one or more software applications, such as a mobile application and a web browser, comprising instructions for execution on the server 160. In some examples, the server 160 may execute one or more applications, such as software applications, that enable, for example, network communications with one or more components of the system 100, transmit and/or receive data, and perform the functions described herein. Upon execution by the processor 161, the application 163 may provide the functions described in this specification, specifically to execute and perform the steps and functions in the process flows described below. Such processes may be implemented in software, such as software modules, for execution by computers or other machines. The application 163 may provide graphical user interfaces (GUIs) through which a user may view and interact with other components and devices within the system 100. The GUIs may be formatted, for example, as web pages in HyperText Markup Language (HTML), Extensible Markup Language (XML) or in any other suitable form for presentation on a display device depending upon applications used by users to interact with the system 100.

The server 160 may further include a display 164 and input devices 165. The display 164 may be any type of device for presenting visual information such as a computer monitor, a flat panel display, and a mobile device screen, including liquid crystal displays, light-emitting diode displays, plasma panels, and cathode ray tube displays. The input devices 165 may include any device for entering information into the server 160 that is available and supported by the server 160, such as a touch-screen, keyboard, mouse, cursor-control device, touch-screen, microphone, digital camera, video recorder or camcorder. These devices may be used to enter information and interact with the software and other devices described herein.

Figure 2:
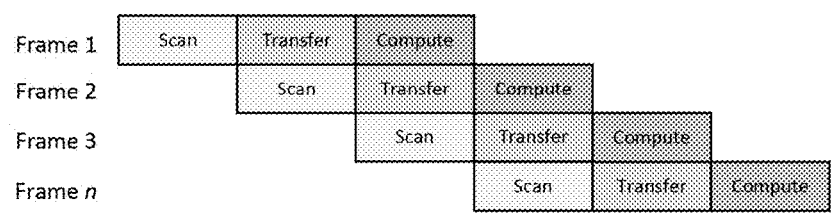
FIG. 2 illustrates a diagram of image processing according to an exemplary embodiment.

FIG. 2 is a block diagram illustrating a process of capturing imaging data, transmitting imaging data over a network, then computing an image by processing the imaging data.

In order to process imaging data most efficiently, the data acquisition processor and server work in concert to process each frame in quick succession. FIG. 2 illustrates Frame 1, Frame 2, and Frame 3 being processed. It is understood that this example is illustrative and that the number of frames can vary greatly up to any number n frames. FIG. 2 may be read starting from the top left and continuing toward the bottom right of the figure. Each frame may contain a multitude of information, including visual and auditory information. The visual images may be multi-dimensional as well as time-overlapping. That is, each frame can be understood as a visual image related to a specific place at a specific time, and such places and times may overlap with previous and later images. As each frame is processed, the system moves on to the next frame. As illustrated in the figure, Frame 1 is scanned, then transferred, then computed. While Frame 1 is being transferred, Frame 2 is being scanned. Similarly, while Frame 1 is being computed, Frame 2 is being transferred and Frame 3 is being scanned and so on. This system ensures that each frame is computed quickly and efficiently in order to display the images back to the user in real time.

Generally, each frame has three stages: scan, transfer, and compute. The scan stage can comprise the scanning of an object or person as performed by a scanning device. The scanning device can be a medical device capable of generating imaging data such as an ultrasound imaging, magnetic resonance imaging (MM), computed tomography (CT) imaging, positron emission topography (PET) imaging, X-ray imaging, mammography imaging, and vascular interventional radiography imaging. This list is illustrative, and it is understood that other categories of imaging, either related or unrelated to medical imaging, may be used. The scan stage can also comprise different forms of image recording, including but not limited to time-shared transmissions, continuous recordings (CTCRs), and multiple beam transmit (MBT) recordings. CTCR and MBT allow multiple transmissions, up to 8, to be overlapping in time and thus reduce the total scan time to be ⅛ of the traditional way. For a typical phase array, the scan time with 128 transmissions can be reduced from 20 ms to 2.5 ms. Additionally, the scan stage can also include a user-specified pattern from the administrator processor, the user-specified pattern comprising at least a predetermined time overlap between the reception and transmission of one or more sets of multi-dimensional imaging data. CTCR can reduce the amount of time required for the data acquisition and reduce the amount of data by overlapping several spatially separated transmissions on top of one another. A data processing sequence, or at least square inversion method, can be applied later to separate the CTCR dataset into dataset as if the transmissions are performed without any overlap. Additionally, each frame can have an associated time stamp so that the administrator processor or user device can display the images or frames in a proper order even though the computation on the server or cloud might have placed them out of order.

In addition to scanning the image, the administrator processor can also compress and blend the image. Image compression is the process of encoding digital image information using fewer bits than an unencoded representation would use. Compression of the image information make the information easier to store and transmit over a network. Image blending is mixing two images of the corresponding pixel values to create a new target image.

Once the frame has been scanned, compressed, and blended, it is transferred to a server. The transfer can occur from an administrative processor to one or more third party servers. The administrator processor may be a device connected by an express bus to the imaging data acquisition device. The transfer can occur automatically or manually by a user. The transfer can occur over either a wired or wireless network such as a cellular network.

Upon transferring the imaging to the server, the imaging data is computed. Computation of the imaging data include decompressing the image data, deblending the imaging data, and generating images. These steps can be performed by one or more processors associated with the server. Additionally, the servers may have one or more databases or data storage units that store the imaging data in any form. These images can be later retrieved by the user or the administrator processor.

Following the computation stage, the images may be transmitted back to the administrator processor over a network. The images can be shown by a display on the administrator processor or some other user device. The images may appear in a multi-dimensional format. The images may appear at a predetermined frame rate congruent with the processing time. The administrator processor or user device may be connected to a database or data storage unit that stores the images or imaging data in some format.

For a typical dataset containing multi-dimensional imaging data, a subsequent transmission of imaging data is activated after the previous one is completely recorded so that each recording does not contain the reflection energy from previous and next transmission. It is understood that additional processing procedures can be applied to handle the imaging data recorded with multiple transmissions on top of each other. As an example, to generate one image, multiple transmissions can be used to insonify the target from different directions. To speed up the scan time, the transmissions can be conducted without waiting for the previous transmissions to be finished, resulting in a time-sharing transmission.

Figure 3:
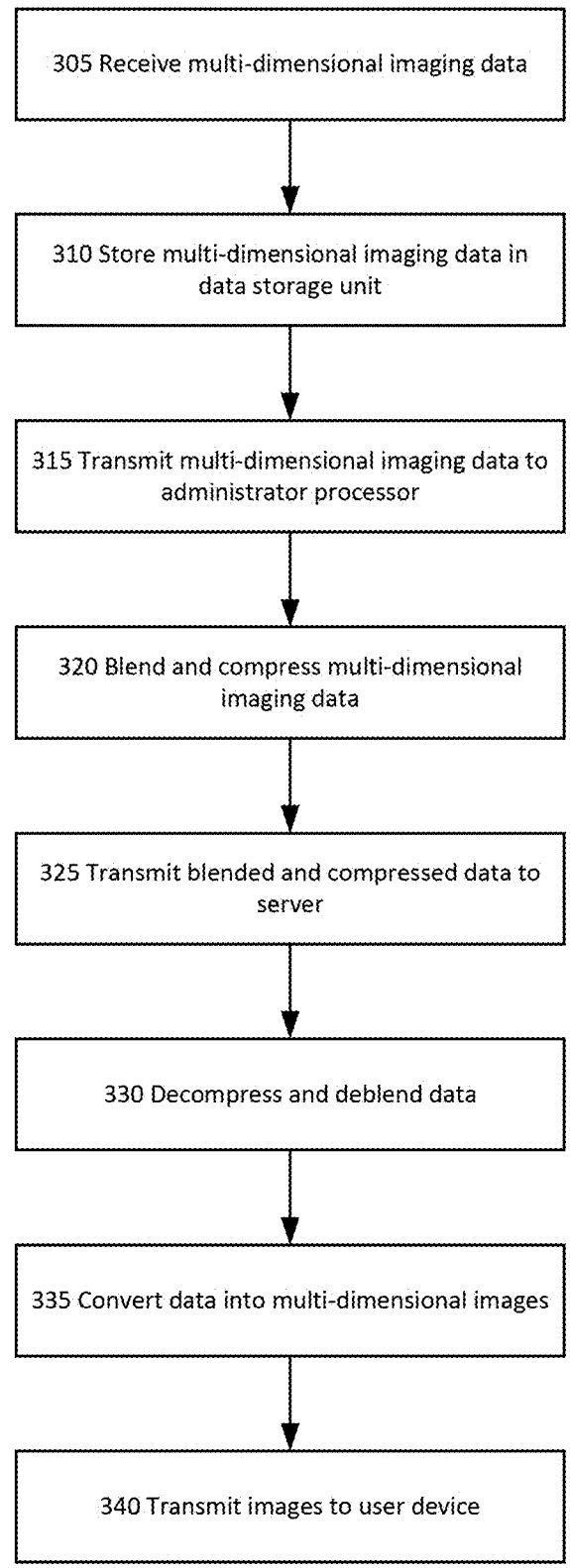
FIG. 3 illustrates a method flowchart according to an exemplary embodiment.

FIG. 3 is a method flowchart illustrating a method of multi-dimensional image processing according to an exemplary embodiment.

The method can begin at action 305 at which point multi-dimensional imaging data is received. This data can be transmitted from a scanning device to a data acquisition device. The scanning device can be associated with medical imaging such as ultrasound, magnetic resonance imaging (MRI), computed tomography (CT) imaging, positron emission topography (PET) imaging, X-ray imaging, mammography imaging, and vascular interventional radiography imaging. This list is illustrative, and it is understood that other categories of imaging, either related or unrelated to medical imaging, may be used. The scan stage can also comprise different forms of image recording, including but not limited to time-shared transmissions, continuous recordings (CTCRs), and multiple beam transmit (MBT) recordings. CTCR and MBT allow multiple transmissions, up to 8, to be overlapping in time and thus reduce the total scan time to be ⅛ of the traditional way. For a typical phase array, the scan time with 128 transmissions can be reduced from 20 ms (128*160 us) to 2.5 ms. Additionally, the scan stage can also include a user-specified pattern from the administrator processor, the user-specified pattern comprising at least a predetermined time overlap between the reception and transmission of one or more sets of multi-dimensional imaging data. CTCR can reduce the amount of time required for the data acquisition and reduce the amount of data by overlapping several spatially separated transmissions on top of one another. A data processing sequence, or at least square inversion method, can be applied later to separate the CTCR dataset into dataset as if the transmissions are performed without any overlap.

Furthermore, the data acquisition processor can acquire radio-frequency ultrasound data using a linear 1D array, a curved 1D array, a phased 1D array, a matrix 2D array transducer, or a 3D array. In this design the recording circuitry of a data acquisition device is always turned on and continuously recording signals arriving at the analog to digital converter (ADC).

In action 310, the multi-dimensional imaging data is stored in the data storage unit. This action may be performed by a processor associated with the data acquisition processor. The data storage unit can be configured to store a large number of multi-dimensional imaging data. The data storage unit may be coupled to the data acquisition processor or the administrator processor. The imaging data can be composed of image frames. Each frame may contain a multitude of information, including visual and auditory information. The visual images may be multi-dimensional as well as time-overlapping.

In action 315, the multi-dimensional imaging data is transmitted to an administrator processor. This action can be performed by a processor associated with the administrator processor. The imaging data may be transmitted to the administrator processor over one or more express buses. The imaging data may be transmitted over a network which can be wired or wireless, such as a cellular network.

For a typical dataset containing multi-dimensional imaging data, a subsequent transmission of imaging data is activated after the previous one is completely recorded so that each recording does not contain the reflection energy from previous and next transmission. It is understood that additional processing procedures can be applied to handle the imaging data recorded with multiple transmissions on top of each other. As an example, to generate one image, multiple transmissions can be used to insonify the target from different directions. To speed up the scan time, the transmissions can be conducted without waiting for the previous transmissions to be finished, resulting in a time-sharing transmission.

In action 320, the imaging data is blended and compressed by the administrator processor. This action can be performed by a processor or some predetermined algorithms associated with the administrator processor. Image compression is the process of encoding digital image information using fewer bits than an unencoded representation would use. Compression of the image information make the information easier to store and transmit over a network. Image blending is mixing two images of the corresponding pixel values to create a new target image. The compressions and blending of the imaging data may be processed frame-by-frame as explained in FIG. 2.

In action 325, the administrator processor transmits the blended and compressed data to the server. The imaging data can be transmitted over a network which can be either wired or wireless. The imaging data may be transmitted frame-by-frame. That is, one frame can be sent at a time. Each frame may be transmitted as soon as it has been processed by the administrator processor. It is understood that other methods of transmission can be used. The server can be a third party server comprising multiple processors and data storage units of its own. The server can be associated with a cloud server or cloud processor. The cloud server may be public, private, or some variation of the two. The cloud server may be preconfigured with some predetermined algorithms to process the imaging data. The choice of imaging algorithms, parameters, and data processing workflows can be determined using a criterion matrix extracted from the geometry and dimension of the dataset. Each frame of ultrasound data can be processed on a single node or multiple nodes depends on the expected elapsed time and memory configuration.

In action 330, the server decompresses and deblends the imaging data. These action can be performed by one or more processors associated with the server. Furthermore, the server can use one or more predetermined algorithms to decompress and deblend the data.

Upon decompressing and deblending the data, in action 335 the server can convert the imaging data in multi-dimensional images. The action can be performed by one or more processors associated with the server.

In action 340, the server can transmit the images back to the user device or administrator processor. The images can be transmitted over a network. The images can be configured to be displayed on the user device or the administrator processor.

Figure 4:
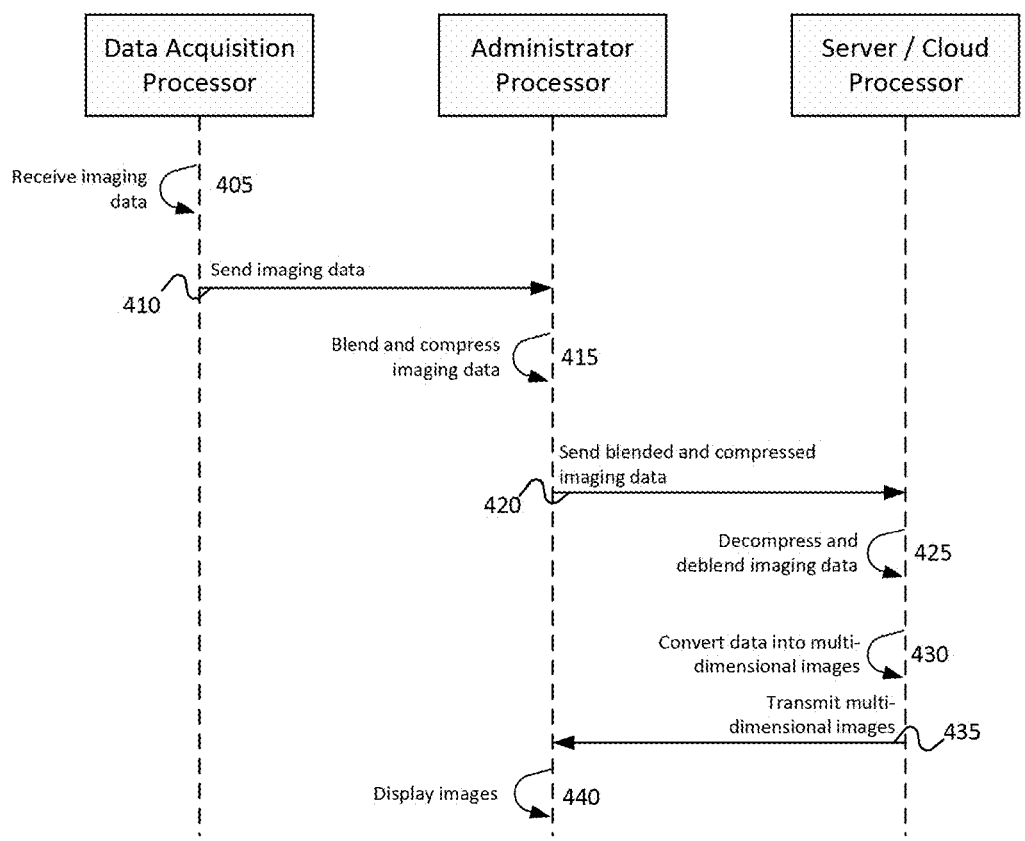
FIG. 4 illustrates a sequence diagram according to an exemplary embodiment.

FIG. 4 is a sequence diagram illustrating a method for processing multi-dimensional images in real time according to an exemplary embodiment. The process can include a data acquisition processor, an administrator processor, and a server or cloud processor. It is understood that other elements may be included.

This process acts under the implication that a medical device such as an ultrasound has collected imaging data from a medical patient. The imaging data may also include magnetic resonance imaging (MM), computed tomography (CT) imaging, positron emission topography (PET) imaging, X-ray imaging, mammography imaging, and vascular interventional radiography imaging.

In action 405, the data acquisition processor receives multi-dimensional imaging data. The data acquisition processor is explained further with reference to FIG. 1. The multi-dimensional imaging data may include both visual and auditory information. Additionally, the data acquisition processor may also receive at least a user-specified pattern from the administrator processor, the user-specified pattern comprising at least a predetermined time overlap between the reception and transmission of one or more sets of multi-dimensional imaging data. This time overlap determines in what manner the imaging data is processed. Furthermore, the data acquisition processor can acquire radio-frequency ultrasound data using a linear 1D array, a curved 1D array, a phased 1D array, a matrix 2D array transducer, or a 3D array. In this design the recording circuitry of a data acquisition device is always turned on and continuously recording signals arriving at the analog to digital converter (ADC).

In action 410, the data acquisition processor transmits the imaging data over a network to the administrator processor. The imaging data may be sent frame-by-frame or in some other batched manner. The network can include a wired or wireless connection, such as a cellular connection. The data acquisition processor and administrator processor may be connected to a data storage unit configured to store the imaging data for later use.

In action 415, the administrator process can compress and blend the imaging data. The administrator processor may compress and blend the images one-by-one or in some other batched manner.

In action 420, the administrator processor transmits the compressed and blended imaging data over a network to the server or cloud processor. The cloud server may be public, private, or some variation of the two. The cloud server may be preconfigured with some predetermined algorithms to process the imaging data.

In action 425, the server or cloud processor decompresses and deblends the imaging data. This action can be performed by some processor or predetermined algorithm associated with the server or cloud processor. This action is performed so that the imaging data can be generated into discernable images. This action can be performed frame-by-frame or in some batched manner. The choice of imaging algorithms, parameters, and data processing workflows can be determined using a criterion matrix extracted from the geometry and dimension of the dataset. Each frame of ultrasound data can be processed on a single node or multiple nodes depends on the expected elapsed time and memory configuration.

In action 430, the server or cloud processor converts the imaging data into multi-dimensional images. This action can be performed by one or more processors associated with the server or cloud. This action can be performed frame-by-frame or in some batched manner. Additionally, the server or cloud may include one or more predetermined algorithms used to convert the data into multi-dimensional images.

Having converted the imaging data, in action 435 the server or cloud processor transmits the multi-dimensional images over a network to the administrator processor. Alternatively, the multi-dimensional images can be sent to a user device. The images may be sent frame-by-frame or in some batched manner. Additionally, each frame can have an associated time stamp so that the administrator processor or user device can display the images or frames in a proper order even though the computation on the server or cloud might have placed them out of order.

In action 440, the administrator processor displays the images in real time. Alternatively, the user device may display the images.

Although embodiments of the present invention have been described herein in the context of a particular implementation in a particular environment for a particular purpose, those skilled in the art will recognize that its usefulness is not limited thereto and that the embodiments of the present invention can be beneficially implemented in other related environments for similar purposes. The invention should therefore not be limited by the above described embodiments, method, and examples, but by all embodiments within the scope and spirit of the invention as claimed.

In the invention, various embodiments have been described with references to the accompanying drawings. It may, however, be evident that various modifications and changes may be made thereto, and additional embodiments may be implemented, without departing from the broader scope of the invention as set forth in the claims that follow. The invention and drawings are accordingly to be regarded in an illustrative rather than restrictive sense.

The invention is not to be limited in terms of the particular embodiments described herein, which are intended as illustrations of various aspects. Many modifications and variations can be made without departing from its spirit and scope. Functionally equivalent systems, processes and apparatuses within the scope of the invention, in addition to those enumerated herein, may be apparent from the representative descriptions herein. Such modifications and variations are intended to fall within the scope of the appended claims. The invention is to be limited only by the terms of the appended claims, along with the full scope of equivalents to which such representative claims are entitled.

It is further noted that the systems and methods described herein may be tangibly embodied in one or more physical media, such as, but not limited to, a compact disc (CD), a digital versatile disc (DVD), a floppy disk, a hard drive, read only memory (ROM), random access memory (RAM), as well as other physical media capable of data storage. For example, data storage may include random access memory (RAM) and read only memory (ROM), which may be configured to access and store data and information and computer program instructions. Data storage may also include storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium), where the files that comprise an operating system, application programs including, for example, web browser application, email application and/or other applications, and data files may be stored. The data storage of the network-enabled computer systems may include electronic information, files, and documents stored in various ways, including, for example, a flat file, indexed file, hierarchical database, relational database, such as a database created and maintained with software from, for example, Oracle® Corporation, Microsoft® Excel file, Microsoft® Access file, a solid state storage device, which may include a flash array, a hybrid array, or a server-side product, enterprise storage, which may include online or cloud storage, or any other storage mechanism. Moreover, the figures illustrate various components (e.g., servers, computers, processors, etc.) separately. The functions described as being performed at various components may be performed at other components, and the various components may be combined or separated. Other modifications also may be made.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The invention claimed is:

1. A system for processing multi-dimensional, time-overlapping imaging data in real time, the system comprising:
    a data acquisition processor configured to receive one or more sets of multi-dimensional images from one or more image collection devices, the data acquisition processor further configured to transmit the one or more sets of multi-dimensional images over one or more express buses;
    a data storage unit configured to store at least one or more sets of multi-dimensional images for later use;
    an administrator processor coupled to the data storage unit, the administrator processor further configured to receive the one or more sets of multi-dimensional images from the data acquisition processor over one or more express buses, blend the one or more sets of multi-dimensional images wherein the blending comprises of combining two or more separate multi-dimensional images into one or more combined multi-dimensional images, compress the one or more sets of multi-dimensional images, and, upon a compression of the one or more sets of multi-dimensional images, transmit the one or more sets of multi-dimensional images over a network in real time; and
    a server configured to receive the one or more sets of multi-dimensional images over the network, the server further configured to decompress the one or more sets of multi-dimensional images, deblend the one or more sets of multi-dimensional images wherein the deblending comprises of uncombining one or more combined multidimensional images into two or more separate multidimensional images, and transmit, over the network, the one or more multi-dimensional images to the administrator processor in real time.

2. The system of claim 1, wherein the data acquisition processor is further configured to receive one or more sets of multi-dimensional images comprising at least time-shared transmissions, continuous recordings (CTCRs), and multiple beam transmit (MBT) recordings.

3. The system of claim 1, wherein the data acquisition processor is further configured to receive at least a user-specified pattern from the administrator processor, the user-specified pattern comprising at least a predetermined time overlap between the reception and transmission of one or more sets of multi-dimensional images.

4. The system of claim 1, wherein the network comprises a wired connection.

5. The system of claim 1, wherein the network comprises a wireless or cellular connection.

6. The system of claim 1, wherein the one or more sets of multi-dimensional images comprise at least ultrasound images, magnetic resonance images (MRI), and computed tomography (CT) images.

7. The system of claim 1, wherein the one or more sets of multi-dimensional images comprise at least positron emission topography (PET) images, X-ray images, and mammography images.

8. The system of claim 1, wherein the one or more sets of multi-dimensional images comprise at least vascular interventional radiography data.

9. The system of claim 1, wherein the system further comprises user device coupled to the administrator processor and data storage unit, the user device further comprising at least a user interface and a display.

10. The system of claim 1, wherein the multi-dimensional images further comprises at least visual and auditory data.

11. The system of claim 1, wherein the administrator processor further comprises at least one or more predetermined algorithms configured to blend and compress one or more sets of multi-dimensional images.

12. A method for processing multi-dimensional imaging data in real time, the method comprising the steps of:
receiving, by a data acquisition processor, one or more sets of multi-dimensional images from one or more image collection devices;
transmitting, by the data acquisition processor, the one or more sets of multi-dimensional images to an administrator processor;
blending, by the administrator processor, the one or more sets of multi-dimensional images wherein the blending comprises of combining one or more separate multi-dimensional images into one or more combined multi-dimensional images;
compressing, upon blending the one or more sets of multi-dimensional images, the one or more sets of multi-dimensional images;
transmitting, upon compressing the one or more sets of multi-dimensional images, the one or more sets of multi-dimensional images to a server;
decompressing, by the server, the one or more sets of multi-dimensional images;
deblending, by the server, the one or more sets of multi-dimensional images wherein the deblending comprises of uncombining one or more combined multidimensional images into two or more separate multidimensional images; and
transmitting, over a network, the one or more multi-dimensional images to the administrator processor;
wherein the decompressing, deblending, and transmitting are in real time.

13. The method of claim 12, wherein the one or more sets of multi-dimensional images comprise at least time-shared transmissions, continuous recordings (CTCRs), and multiple beam transmit (MBT) recordings.

14. The method of claim 12, wherein the method further comprises:
receiving, by the administrator processor, at least a user-specified pattern from the administrator processor, the user-specified pattern comprising at least a predetermined time overlap between the reception and transmission of one or more sets of multi-dimensional images.

15. The method of claim 12, wherein the one or more sets of multi-dimensional images comprise at least ultrasound images, magnetic resonance images (MRI), and computed tomography (CT) images.

16. The method of claim 12, wherein the one or more sets of multi-dimensional images comprise at least positron emission topography (PET) images, X-ray images, and mammography images.

17. The method of claim 12, wherein the one or more sets of multi-dimensional images comprise at least vascular interventional radiography data.

18. A computer readable non-transitory medium comprising computer executable instructions that, when executed on a processor, perform procedures comprising the steps of:
receiving, by a data acquisition processor, one or more sets of multi-dimensional images from one or more image collection devices;
transmitting, by the data acquisition processor, the one or more sets of multi-dimensional images to an administrator processor;
blending, by the administrator processor, the one or more sets of multi-dimensional images wherein the blending comprises of combining one or more separate multi-dimensional images into one or more combined multi-dimensional images;
compressing, upon blending the one or more sets of multi-dimensional images, the one or more sets of multi-dimensional images;
transmitting, upon compressing the one or more sets of multi-dimensional images, the one or more sets of multi-dimensional images to a server;
decompressing, by the server, the one or more sets of multi-dimensional images;
deblending, by the server, the one or more sets of multi-dimensional images wherein the deblending comprises of uncombining one or more combined multidimensional images into two or more separate multidimensional images; and
transmitting, over a network, the one or more multi-dimensional images to the administrator processor;
wherein the decompressing, deblending, and transmitting are in real time.

19. The medium of claim 18, wherein the processor is further configured to transmit the one or more sets of multi-dimensional images to a data storage unit configured to store data for later use.

20. The medium of claim 18, wherein the image collection devices are further configured to generate the multi-dimensional images from a scanning device associated with medical imaging.

21. The medium of claim 18, wherein the server is associated with one or more cloud computing systems configured to process and convert the multi-dimensional images into images, the one or more cloud computing systems comprising at least one selected from the group of: private clouds, public clouds, hybrid clouds, and multi-clouds.

22. The medium of claim 21, wherein the cloud computing systems are configured to convert and transmit the multi-dimensional images in real time back to the administrator processor.

* * * * *